United States Patent
Porter et al.

(10) Patent No.: US 11,355,165 B2
(45) Date of Patent: Jun. 7, 2022

(54) ADJUSTING PARAMETERS OF CHANNEL DRIVERS BASED ON TEMPERATURE

(71) Applicant: Micron Technology, Inc., Boise, ID (US)

(72) Inventors: John David Porter, Boise, ID (US); Suryanarayana B. Tatapudi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/859,417

(22) Filed: Apr. 27, 2020

(65) Prior Publication Data

US 2021/0335396 A1    Oct. 28, 2021

(51) Int. Cl.
*G11C 7/04* (2006.01)
*G06F 3/06* (2006.01)
*G11C 11/22* (2006.01)

(52) U.S. Cl.
CPC .............. *G11C 7/04* (2013.01); *G06F 3/0653* (2013.01); *G06F 3/0655* (2013.01); *G11C 11/221* (2013.01)

(58) Field of Classification Search
CPC ....... G11C 7/04; G11C 11/221; G06F 3/0653; G06F 3/0655
See application file for complete search history.

(56) References Cited

U.S. PATENT DOCUMENTS

| | | | | |
|---|---|---|---|---|
| 2008/0122478 A1* | 5/2008 | Mei | ..................... | G11C 11/4074 326/27 |
| 2009/0079357 A1* | 3/2009 | Shteynberg | ............ | H05B 45/37 315/291 |
| 2009/0079358 A1* | 3/2009 | Shteynberg | ........ | H05B 45/3725 315/291 |
| 2010/0005366 A1* | 1/2010 | Dell | ...................... | G06F 11/073 714/758 |

(Continued)

FOREIGN PATENT DOCUMENTS

| TW | 201928952 A | 7/2019 |
|---|---|---|
| TW | 201937297 A | 9/2019 |

OTHER PUBLICATIONS

Taiwan Intellectual Property Office, "Office Action," issued in connection with ROC (Taiwan) Patent Application No. 110112676, dated Dec. 24, 2021 (7 pages).

*Primary Examiner* — Henry Tsai
*Assistant Examiner* — Aurangzeb Hassan
(74) *Attorney, Agent, or Firm* — Holland & Hart LLP

(57) ABSTRACT

Methods, systems, and devices are described for adjusting parameters of channel drivers based on temperature when a calibration component is unavailable. A memory device may determine whether a calibration component is available for use by the memory device. If not, the memory device may select an impedance setting for the driver that is based on an operating temperature of the memory device. A device or system may identify a temperature of a memory device, identify that a calibration component is unavailable to adjust (Continued)

a parameter of a driver of a data channel, select a value of the parameter based on the temperature and on identifying that the calibration component is unavailable, adjust the parameter of the driver of the data channel to the selected value, and transmit, by the driver operating using the selected value of the parameter, a signal over the channel.

22 Claims, 7 Drawing Sheets

(56) References Cited

U.S. PATENT DOCUMENTS

| | | | |
|---|---|---|---|
| 2010/0293305 A1* | 11/2010 | Park | G11C 7/04 710/33 |
| 2015/0067292 A1* | 3/2015 | Grunzke | G11C 7/1057 711/170 |
| 2015/0130531 A1* | 5/2015 | Tadinada | G01K 7/01 327/513 |
| 2016/0133324 A1* | 5/2016 | Alrod | G11C 13/0097 365/148 |
| 2017/0301396 A1* | 10/2017 | Dhori | G11C 11/418 |
| 2020/0050581 A1* | 2/2020 | Pinilla Pico | G06F 9/30134 |
| 2020/0066309 A1* | 2/2020 | Mayer | G11C 11/5657 |
| 2020/0159674 A1* | 5/2020 | Morgan | G06F 12/1408 |
| 2020/0343245 A1* | 10/2020 | Yamazaki | G11C 11/405 |

* cited by examiner

ADJUSTING PARAMETERS OF CHANNEL DRIVERS BASED ON TEMPERATURE

BACKGROUND

The following relates generally to one or more memory systems and more specifically to adjusting parameters of data channel drivers based on temperature.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Impedance mismatches on traces connecting a memory controller to memory outputs may result in reflections and ringing on the signals. Reducing or minimizing these impedance mismatches in a signal path may help performance of a circuit, such as a memory device, by reducing the reflections and ringing. To help reduce these impedance discontinuities, a calibration scheme may be used. Some memory systems may use a calibration component to adjust an impedance associated with a driver of a channel based on temperature. In some cases, a portion of a memory system may not be able to use the calibration component in some scenarios.

Systems, devices, and techniques are described to adjust the impedance associated with a driver of a channel based at least in part on a temperature of a memory device when a calibration component is unavailable. The memory device may determine whether a calibration component is available for use by the memory device. If not, the memory device may select an impedance setting for the driver that is based on an operating temperature of the memory device.

Features of the disclosure are initially described in the context of memory systems and dies as described with reference to FIGS. 1-2. Features of the disclosure are described in the context of a system and a flowchart that relate to adjusting parameters of channel drivers based on temperature as described with reference to FIGS. 3-4. These and other features of the disclosure are further illustrated by and described with reference to an apparatus diagram and flowcharts that relate to adjusting parameters of channel drivers based on temperature as described with reference to FIGS. 5-7.

Figure 1:
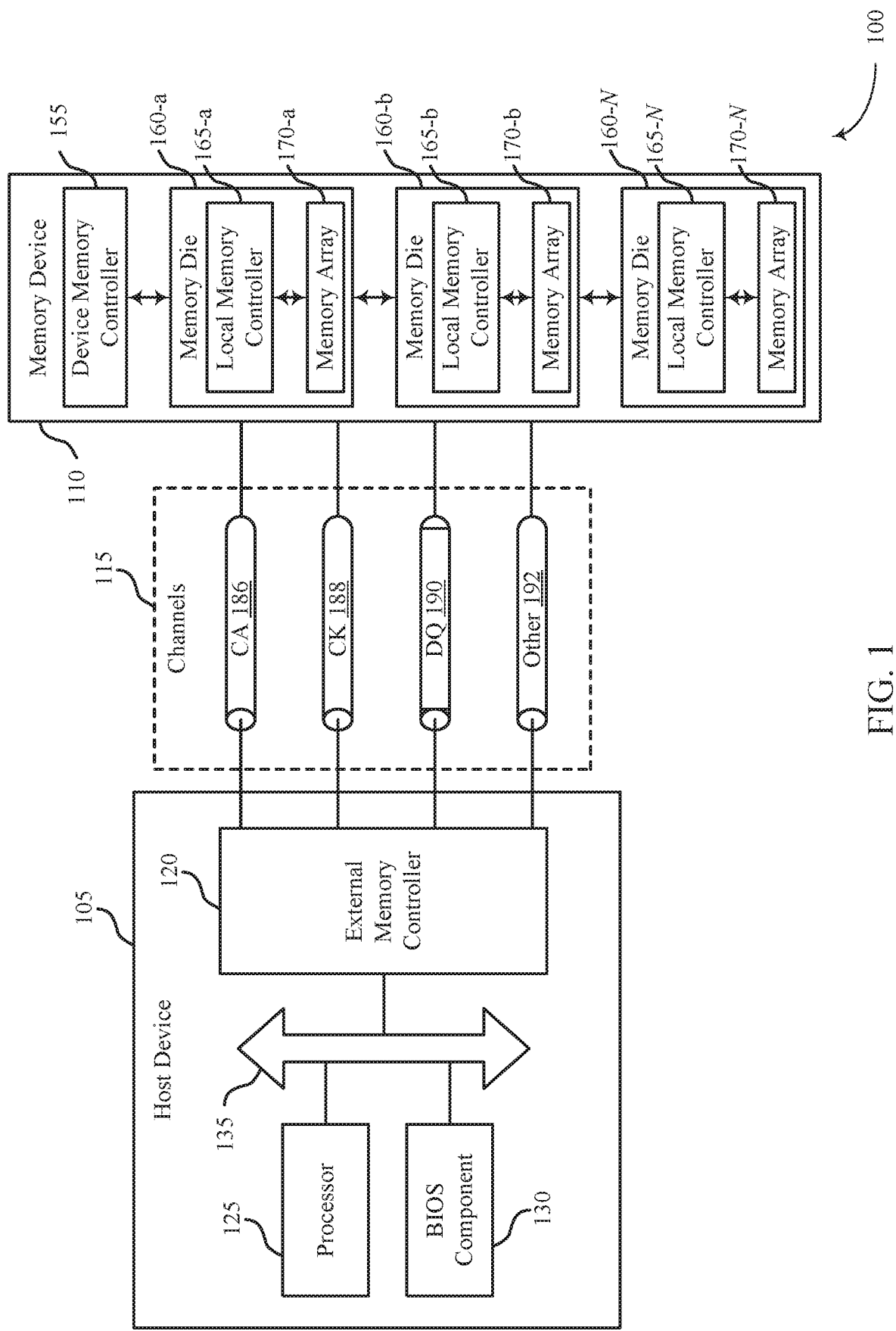
FIG. 1 illustrates an example of a system that supports adjusting parameters of channel drivers based on temperature in accordance with examples as disclosed herein.

FIG. 1 illustrates an example of a system 100 that supports adjusting parameters of channel drivers based on temperature in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The device memory controller 155 or the local memory controllers or both may also include driver calibrators for adjusting parameters of channel drivers. For example, the device memory controller 155 or the local memory controllers or both may include driver calibrators for adjusting an impedance associated with a driver of a channel based on temperature in accordance with examples as disclosed herein.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Figure 2:
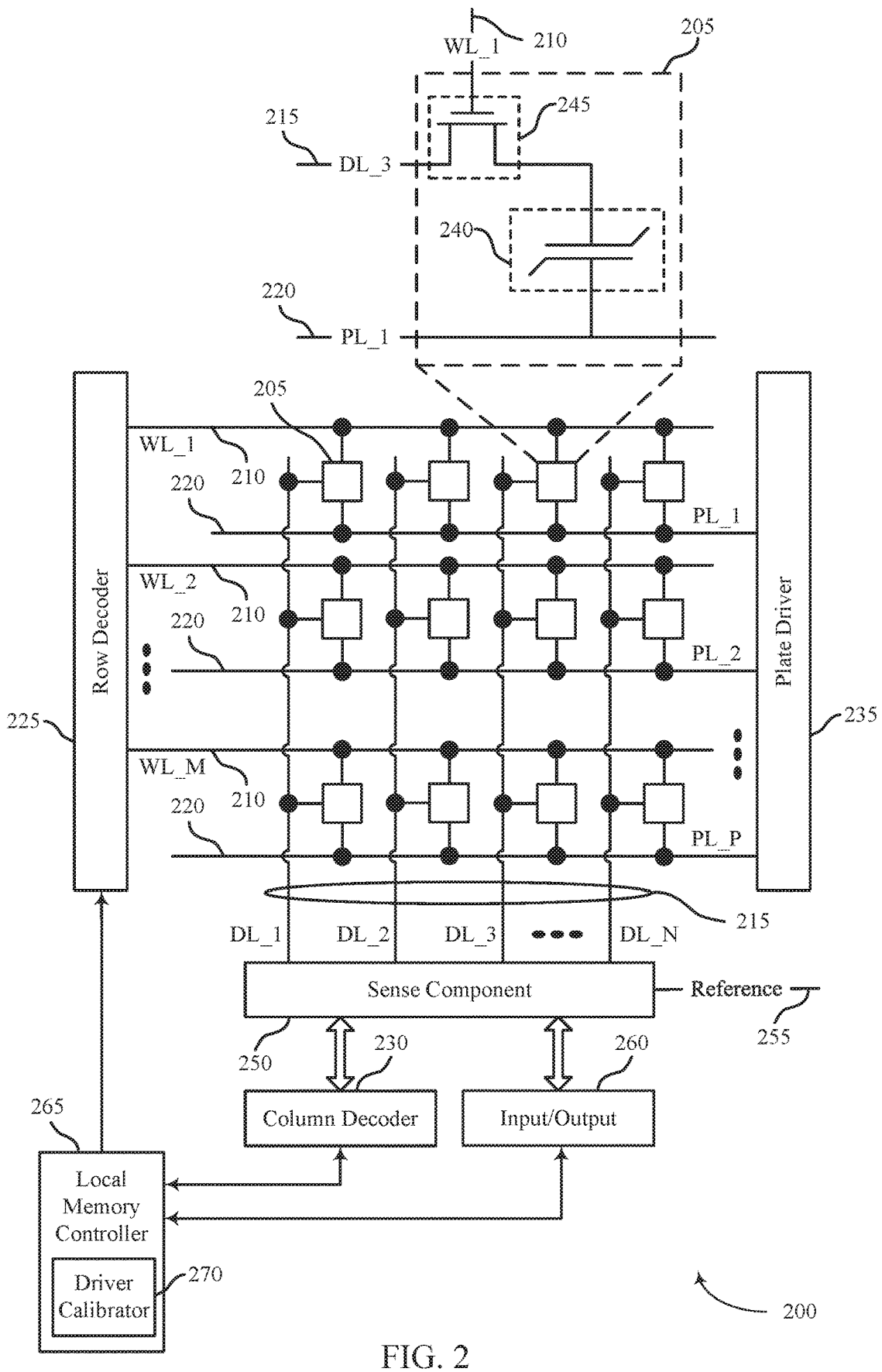
FIG. 2 illustrates an example of a memory die that supports adjusting parameters of channel drivers based on temperature in accordance with examples as disclosed herein.

FIG. 2 illustrates an example of a memory die 200 that supports adjusting parameters of channel drivers based on temperature in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage). The detected logic state of the memory cell 205 may be provided as an output of the sense component 250 (e.g., to an input/output 260), and may indicate the detected logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205. The local memory controller 265 may include a driver calibrator 270 that adjusts parameters of data channel drivers based on temperature in accordance with examples as disclosed herein. For example, the driver calibrator 270 may adjust an impedance associated with a driver of a channel based on temperature to minimize impedance mismatches.

The local memory controller 265 may be operable to perform a write operation (e.g., a programming operation) on one or more memory cells 205 of the memory die 200. During a write operation, a memory cell 205 of the memory die 200 may be programmed to store a desired logic state. The local memory controller 265 may identify a target memory cell 205 on which to perform the write operation. The local memory controller 265 may identify a target word line 210, a target digit line 215, and a target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The local memory controller 265 may apply a specific signal (e.g., write pulse) to the digit line 215 during the write operation to store a specific state (e.g., charge) in the capacitor 240 of the memory cell 205. The pulse used as part of the write operation may include one or more voltage levels over a duration.

While the features of the present disclosure are described with reference to ferroelectric memory technology, such as ferroelectric RAM (FeRAM), these features may be implemented in other memory technologies. For example, the features of the present disclosure may be used with dynamic RAM (DRAM), synchronous dynamic RAM (SDRAM), magnetic RAM (MRAM), resistive RAM (RRAM), flash memory, phase change memory (PCM), others, or any combination thereof.

Figure 3:
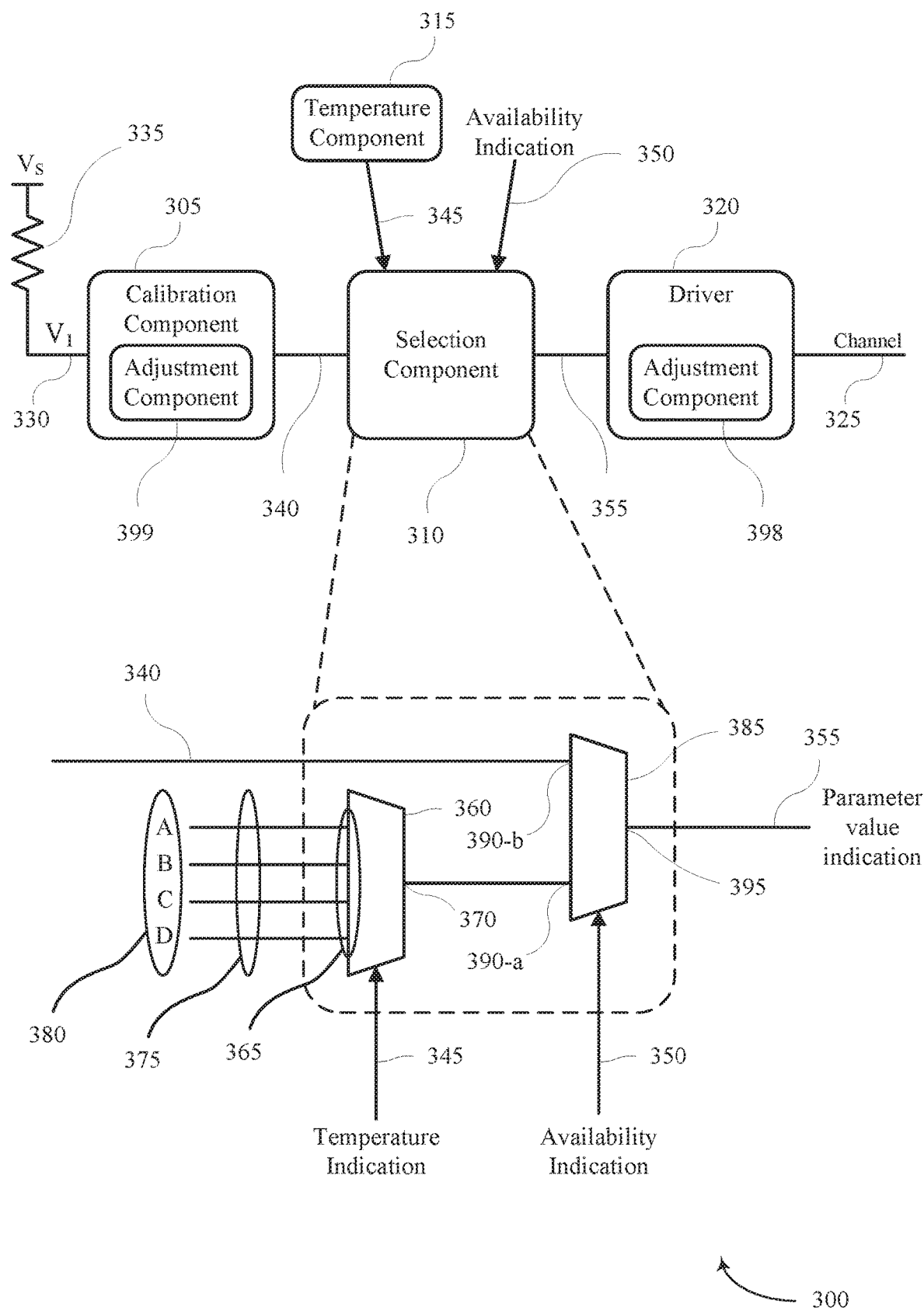
FIG. 3 illustrates an example of a system that supports adjusting parameters of channel drivers based on temperature in accordance with examples as disclosed herein.

FIG. 3 illustrates an example of a system 300 that supports adjusting parameters of channel drivers based on temperature in accordance with examples as disclosed herein. The system 300 may be an example of a driver calibrator 270 described with reference to FIG. 2. Reducing or minimizing impedance mismatch on traces connecting a memory controller to memory outputs may help reduce reflections and ringing on the signals. To help reduce these impedance discontinuities, a calibration scheme may be used. Some memory systems may use a calibration component to adjust an impedance associated with a driver of a channel based on temperature. In some cases, a portion of a memory system may not be able to use the calibration component.

The system 300 may adjust the impedance associated with a driver of a channel based at least in part on a temperature of a memory device when a calibration component is unavailable. The system 300 may determine whether a calibration component is available for use by the memory device. If not, the system 300 may select an impedance setting for the driver that is based on an operating temperature of the memory device. The system 300 may include a calibration component 305, a selection component 310, a temperature component 315, and a driver 320.

The calibration component 305 may determine a desired value for a parameter of the driver 320. The calibration component 305 may send an indication to the driver 320, via the selection component 310, of the desired value to use for the parameter. In one example, the indication is a single number. In one example, the indication is a code. Other indications are also possible. In some examples, the parameter may be an impedance associated with a driver 320 of a channel 325, e.g., a data channel or a command and address channel. The calibration component 305 may determine a desired value for the impedance based on voltage matching. In some examples, the calibration component 305 may determine a resistance that the driver 320 may use to reduce reflections and ringing when driving the channel 325. In some cases, the calibration component 305 may be an example of a ZQ calibration component.

The calibration component 305 may include an input 330 coupled with one end of a resistor 335, e.g., a (±1%) 240Ω resistor 335. The resistor 335 may be used to calibrate the internal resistance for the channel 325. The resistor 335 may be installed outside or inside the memory device 110. The other end of the resistor 335 may be coupled with a system voltage Vs. The voltage Vs may be a high voltage Vh, such as Vpp, or a low voltage VL, such as Vss or ground. The resistor 335 and an adjustment component 399 may both form a voltage divider and cause a voltage V1 to appear at the input 330. The adjustment component 399 may include an internal set of transistors and resistors within calibration component 305. In some cases, the calibration component 305 may use a driver (e.g., similar to the driver 320) for the internal set of transistors and resistors. There may be a desired voltage level for voltage V1. The resistance of the resistor 335 and the internal set of transistors and resistors of adjustment component 399 may vary based on temperature, which may cause the voltage V1 to vary. To bring the voltage V1 to the desired level, the calibration component 305 may add or remove additional transistors and resistors to adjust the resistance between the input line 330 and the voltage VSS or ground until the voltage V1 matches the desired voltage level. The calibration component 305 may send an indication of the determined resistance value to the selection component 310, which may pass it on to the driver 320 for the driver 320 to use for the parameter value. In one example, the indication is a single number. In one example, the indication is a code. Other indications are also possible.

There may be times when the calibration component 305 may not be available to calibrate the driver 320. For example, in some examples, the resistor 335 may not be installed on the memory device 110, making calibration unavailable. In some examples, the resistor 335 may be shared across multiple drivers 320. In those cases, when the resistor 335 is being used to calibrate one of the drivers 320, the resistor 335 may not be available for calibration of one or more of the other drivers 320. In some examples, the calibration component 305 may be halted. For example, some mobile systems may employ a low-power mode in which the calibration component 305 is shut down to preserve power. In those cases, the calibration component 305 may not be available to calibrate the driver 320. There may be other times when the calibration component 305 may not be available.

The temperature component 315 may determine at least one temperature of the memory device 110 and output an indication thereof to the selection component 310. The temperature component 315 may include a temperature sensor. In some examples, the temperature indication may be a single value, such as what may be output by a thermistor. In some examples, the temperature indication may be a code that may be decoded by the selection component 310. Other temperature indications may also be possible. The temperature component 315 may reside on the memory device 110.

The selection component 310 may determine which of a quantity of values may be used to calibrate a parameter of the driver 320, based on temperature and whether the calibration component 305 is available. The selection component 310 may be coupled with the calibration component 305, the temperature component 315, and the driver 320. The selection component 310 may receive from the calibration component 305 an indication of the desired value to use for the driver parameter 340. The selection component 310 may receive from the temperature component 315 an indication of the temperature 345. The selection component 310 may also receive an availability indication 350 of whether the calibration component 305 is available for calibrating the driver 320. Based at least in part on these inputs, the selection component 310 may send to the driver 320 an indication of the parameter value to use 355.

If the availability indication reflects that the calibration component 305 is available, the selection component 310 may obtain the indication of the parameter value determined by the calibration component 305. The selection component 310 may then pass this information on to the driver 320. In some examples, the selection component 310 may couple the calibration component 305 with the driver 320 so the calibration component 305 may send the indication of the parameter value to the driver 320 directly. In some examples, the calibration component 305 may send an indication of the amount of resistance the driver 320 may use as determined by the calibration component 305.

The selection component 310 may receive the indication of the temperature of the memory device from the temperature component 315. In some examples, the temperature indication may be a single value. In some examples, the temperature indication may be a code. Other indications may also be possible.

If the availability indication reflects that the calibration component 305 is not available, the selection component 310 may, based on the temperature indication, select from a plurality of parameter values to use for the parameter of the driver 320. The parameter values may be stored by a memory component of the memory device. In some examples, each parameter value may correspond to a different temperature. In some examples, each parameter value may correspond to a different range of temperatures. In some examples, the selection component 310 may identify the temperature to be within a range of temperatures, and the parameter value may be selected based on the range of temperatures. In some examples, the selection component 310 may identify first and second parameter values corresponding to a low endpoint and a high endpoint of the range of temperatures, and the parameter value may be selected by performing an interpolation procedure based on the temperature, the range of temperatures, and the first and second parameter values. In some examples, the selection component 310 may identify the parameter value from a quantity (e.g., a finite number) of values, such as, e.g., four, eight, sixteen, or other quantities of parameter values.

In some examples, the plurality of parameter values may be examples of one or more trim settings. In some examples, the selection component 310 may select a trim setting from a plurality of trim settings based on the temperature of the memory device. In some examples, each trim setting may correspond to a different temperature. In some examples, each trim setting may correspond to a different range of temperatures. The trim settings may be determined for the memory device beforehand (e.g., at the time of designing or at the time of manufacturing) by testing the memory device at different temperatures. The trim setting for each temperature may be stored by a memory component of the memory device.

The selection component 310 may include a first multiplexer 360 that may include a plurality of inputs 365 and an output 370. The first multiplexer may be configured to select one of the inputs 365 to couple with the output 370 based on the temperature. Each input 365 may receive a different value of the parameter corresponding to a different temperature or temperature range. In some examples, the inputs 365 may be coupled with a plurality of conductive lines 375 that each correspond to a different value of the parameter. In some examples, each conductive line 375 may correspond to a different trim setting 380. The first multiplexer 360 may receive the temperature indication 345 from the temperature component 315 and based thereon, may select which input 365 to couple with the output 370.

The selection component 310 may include a second multiplexer 385 that may include a plurality of inputs 390 and an output 395. The output 395 may be coupled with the driver 320. The second multiplexer 385 may be configured to select one of the inputs 390 to couple with the output 395. In some examples, the second multiplexer 385 may include a first input 390-a coupled with the output 370 of the first multiplexer 360 and a second input 390-b coupled with the calibration component 305 to receive the driver parameter value 340 determined thereat.

The second multiplexer 385 may receive the availability indication 350 to determine which input 390 to couple with the output 395. If the availability indication 350 reflects that the calibration component 305 is available, the second multiplexer 385 may couple the second input 390-b with the output 395. This may couple the calibration component 305 with the driver 320. The calibration component 305 may then send the indication of the parameter value to the driver 320 through the second multiplexer 385. In some cases, the calibration component 305 may send an indication of the amount of resistance that the driver 320 may use as determined by the calibration component 305.

If the availability indication 350 reflects that the calibration component 305 is not available, the second multiplexer may couple the first input 390-a to the output. This may couple the selected parameter value output by the first multiplexer 360 with the driver 320. In some examples, this may couple a conductive line 375 corresponding to the selected trim setting 380 with the driver 320.

The driver 320 may be used to drive loads on a channel 325. The driver 320 may also act as on-die termination (ODT) to cure impedance mismatches at the end of transmission lines, e.g., lines of a data channel or a command and address channel. The driver 320 may receive the parameter value indication 355 from the selection component 310 and configure the driver's parameter based thereon. Depending on the availability indication, the parameter value indication may originate from the calibration component 305 or the first multiplexer 360. If originating from the first multiplexer 360, the parameter value indication may be dependent on the temperature. In some examples, the parameter may be an impedance of the driver 320 and the parameter value indication may represent a value to use for the parameter to minimize an impedance mismatch with the channel 325.

The driver 320 may include an adjustment component 398 that may configure the parameter of the driver 320 based on the parameter value indication received from the selection component 310. The adjustment component 398 may decode or otherwise determine the desired parameter value based on the parameter value indication. The adjustment component 398 may then configure the driver 320 based on the desired parameter value. In some examples, the parameter may be an impedance of the driver 320 and the adjustment component may include a set of transistors and resistors. The resistance of the transistors and resistors of adjustment component 398 may vary based on temperature. The adjustment component 398 may be positioned within the driver 320, as depicted. Alternatively, the adjustment component 398 may be positioned outside the driver 320.

The channel 325 may be any channel 325 on the memory device. In some examples, the channel 325 may be a data channel. In some examples the channel 325 may be a command and address channel. After the parameter has been configured using the selected parameter value, the driver 320 may transmit a signal over the channel 325 using the parameter. In some examples, the selected parameter value may minimize an impedance mismatch on the channel 325 that may help reduce reflections and ringing on the signals based on temperature.

The memory device may be a memory die and one or more of the system components may reside on or in the memory die. For example, one or more of the calibration component 305, the selection component 310, the temperature component 315, or the driver 320 may reside on or in the memory die.

Figure 4:
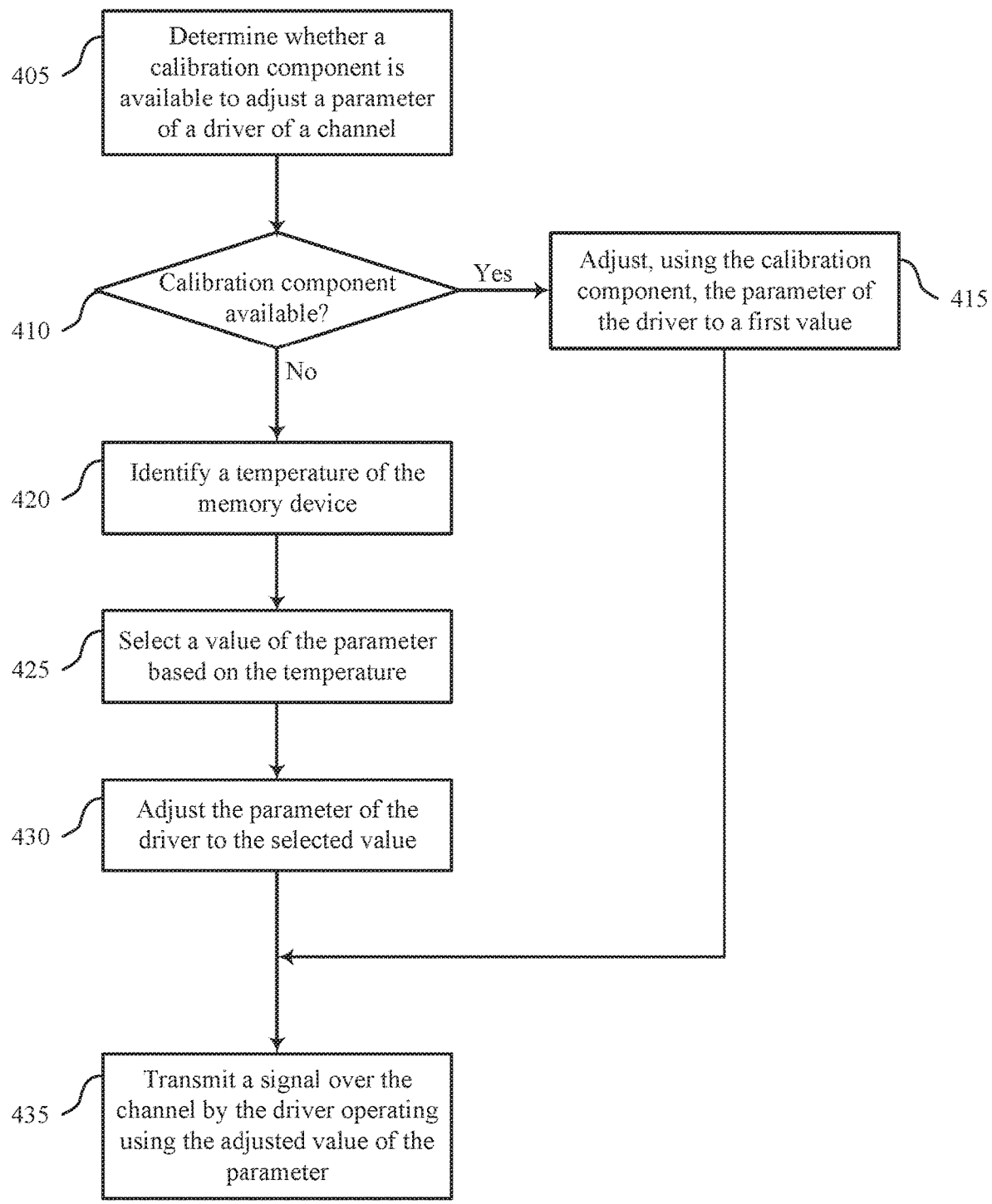
FIG. 4 shows a flowchart illustrating a method that supports adjusting parameters of channel drivers based on temperature in accordance with examples as disclosed herein.

FIG. 4 shows a flowchart illustrating a method 400 that supports adjusting parameters of channel drivers based on temperature in accordance with examples as disclosed herein. The operations of method 400 may be implemented by a memory device or its components as described herein. In some examples, a memory device may execute a set of instructions to control the functional elements of the memory device to perform the described functions. Additionally or alternatively, a memory device may perform aspects of the described functions using special-purpose hardware.

At 405, the memory device may determine whether a calibration component is available to adjust a parameter of a driver of a memory device. A calibration component may not be available for various reasons, including, e.g., a resistor not being installed, the resistor being used by a different driver, or a system mode being used in which the calibration component may be halted. Other reasons may also exist for unavailability of the calibration component. In some examples, the driver may be a driver of a data channel. In some examples, the parameter may be a configurable impedance of the driver of the data channel. In some examples, a control signal may be received and used to indicate whether the calibration component may be available to adjust the parameter of the driver.

At 410, if the memory device has determined that the calibration component is available—as determined at 405—the method may continue to method step 415. If the memory device has determined that the calibration component is unavailable, the method may continue to method step 420.

At 415, the memory device may adjust, using the calibration component, the parameter of the driver to a first value. In some examples, the driver parameter may be an impedance of the driver that may minimize an impedance mismatch with the channel.

At 420, the memory device may identify a temperature of the memory device. In some examples, a signal representing the temperature of the memory device may be received from a temperature sensor and may be used to identify the temperature. In some examples, the signal may be a control signal.

At 425, the memory device may select a value of the parameter of the driver based on the temperature of the memory device. In some examples, a trim setting may be selected from a plurality of trim settings based on the temperature of the memory device. In some examples, each trim setting may correspond to a different temperature. In some examples, each trim setting may correspond to a different range of temperatures. In some examples, the temperature of the memory device may be identified to be within a range of temperatures, and the parameter value may be selected based on the range of temperatures. In some examples, first and second parameter values may be identified corresponding to low and high endpoints of the range of temperatures, and the parameter value may be selected by performing an interpolation procedure based on the temperature, the range of temperatures, and the first and second parameter values. In some examples, the parameter value may be selected from a quantity of values, such as, e.g., four, eight, 16, or other quantities of parameter values.

At 430, the memory device may adjust the parameter of the driver to the selected value. In some examples, the configurable impedance of the driver of a data channel may be adjusted by coupling the data channel with a conductive line that corresponds to a selected trim setting. In some examples, adjusting the configurable impedance of the driver may cause a termination impedance of the data channel to be at a configured value.

At 435, the memory device may transmit a signal over the channel by the driver operating using the adjusted value of the parameter. If the memory device determined that the calibration component was available at step 405, the adjusted value of the parameter may be the first value. If the memory device determined that the calibration component was unavailable at step 405, the adjusted value of the parameter may be the selected value. In some examples, the parameter may be a configurable impedance of the driver of a data channel that may minimize an impedance mismatch with the channel.

Figure 5:
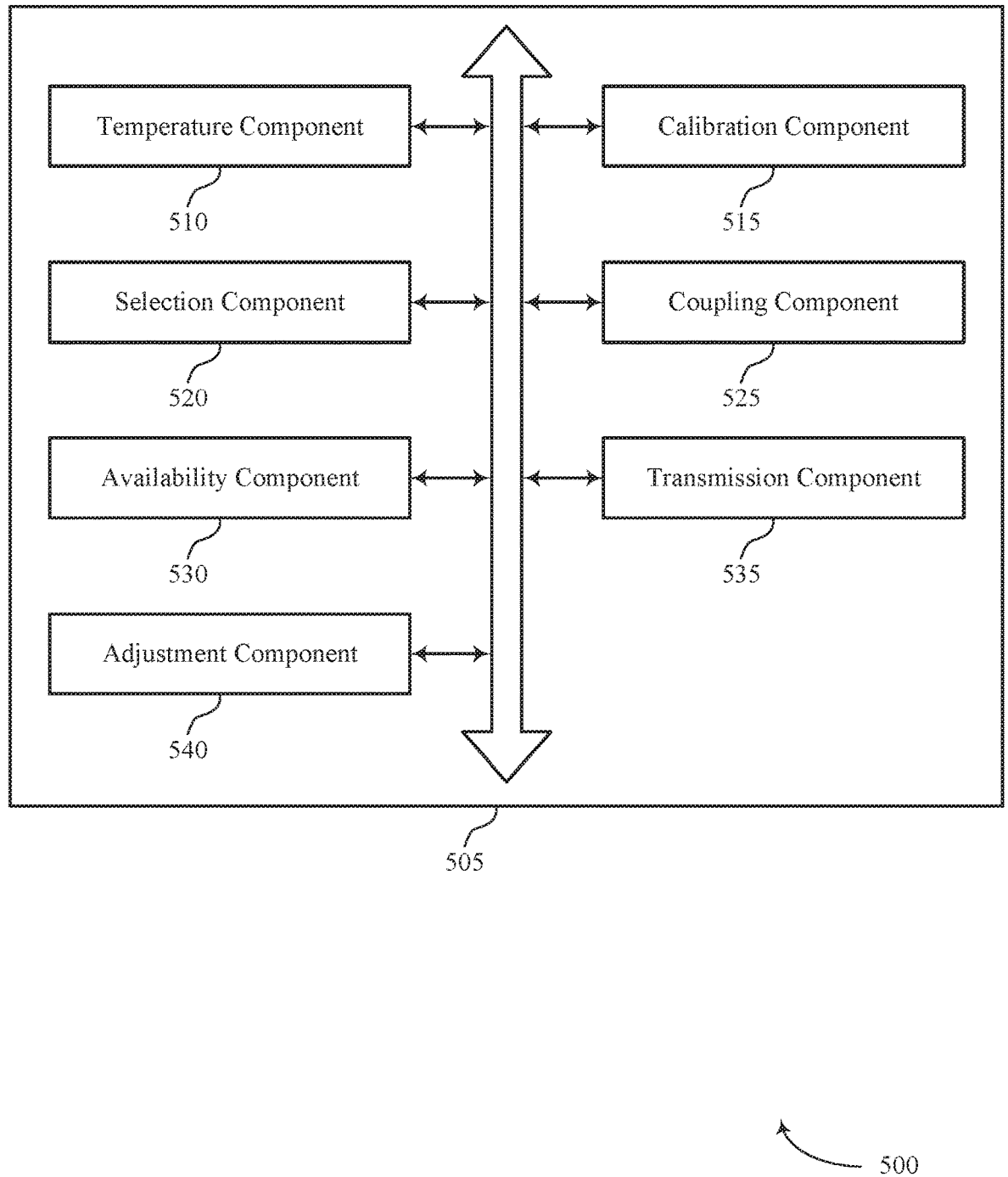
FIG. 5 shows a block diagram of a memory device that supports adjusting parameters of channel drivers based on temperature in accordance with examples as disclosed herein.

FIG. 5 shows a block diagram 500 of a memory device 505 that supports adjusting parameters of channel drivers based on temperature in accordance with examples as disclosed herein. The memory device 505 may be an example of aspects of a memory device as described with reference to FIGS. 3-4. The memory device 505 may include a temperature component 510, a calibration component 515, a selection component 520, a coupling component 525, an availability component 530, a transmission component 535, and an adjustment component 540. Each of these modules may communicate, directly or indirectly, with one another (e.g., via one or more buses).

The temperature component 510 may identify a temperature of a memory device. In some examples, the temperature component 510 may identify a second temperature of the memory device that is different than the temperature. In some examples, the temperature component 510 may comprise a temperature sensor of the memory device. In some examples, the temperature sensor may generate a control signal that indicates the temperature.

The calibration component 515 may when the calibration component is available: adjust, using the calibration component, the parameter of the driver to a first value.

The selection component 520 may select a value of the parameter based on the temperature and on identifying that the calibration component is unavailable. In some examples, the selection component 520 may when the calibration component is unavailable: identify a temperature of the memory device and select a second value of the parameter based on the first value. In some examples, the selection component 520 may select the value from a set of trim settings that each corresponds to a different temperature or different range of temperatures. In some examples, the selection component 520 may select a second value from a set of trim settings, the second value corresponding to the second temperature and being different than the value. In some examples, the selection component may receive a control signal that indicates the temperature, where identifying the temperature is based on receiving the control signal In some examples, the selection component 520 may identify a range of temperatures that includes the temperature, where identifying the temperature is based on identifying the range of temperatures. In some examples, the selection component 520 may identify a second value of the parameter, the second value being associated with an endpoint temperature of the range of temperatures. In some examples, the selection component 520 may identify a difference between the temperature and the endpoint temperature of the range of temperatures.

In some examples, the selection component 520 may perform an interpolation procedure using the difference, the endpoint temperature, and the second value, where selecting the value of the parameter is based on performing the interpolation procedure. In some cases, the value of the parameter is selected from a set of trim settings that each corresponds to a different range of temperatures. In some cases, the value is selected from a quantity of values. In some cases, the value is selected from eight values.

The availability component 530 may identify that a calibration component is unavailable to adjust a parameter of a driver of a data channel. In some examples, the availability component 530 may identify whether a calibration component is available to adjust a parameter of a driver of a memory device. In some examples, the availability component 530 may receive a control signal that indicates whether the calibration component is available to adjust the parameter of the driver, where identifying that the calibration component is unavailable to adjust the parameter of the driver is based on receiving the control signal.

The transmission component 535 may transmit, by the driver operating using the selected value of the parameter, a signal over the data channel. In some examples, the transmission component 535 may transmit, by the driver operating using the first value or the second value of the parameter, a signal over a channel. In some examples, the transmission component 535 may transmit, by the driver operating using the second value of the parameter, a second signal over the data channel. In some cases, the parameter includes a configurable impedance of the driver. In some cases, the value of the parameter includes a numeric quantity of the configurable impedance of the driver.

The adjustment component 540 may adjust the parameter of the driver of the data channel to the selected value. In some examples, the adjustment component 540 may receive an indication of the selected value and configure the parameter of the driver based at least in part on the indication. In some examples, the adjustment component 540 may adjust the parameter of the driver of the data channel to the value based on coupling the data channel with a conductive line. In some examples, the adjustment component 540 may adjust the parameter of the driver of the data channel to the second value based on coupling the data channel with the second conductive line. In some examples, the adjustment component 540 may adjust the configurable impedance of the driver causes a termination impedance of the data channel to be at a configured value.

The coupling component 525 may couple the data channel with a conductive line that corresponds to the selected trim setting from the set of trim settings, where adjusting the parameter of the driver is based on coupling the data channel with the conductive line. In some examples, the coupling component 525 may couple the data channel with a second conductive line that corresponds to the selected second value.

Figure 6:
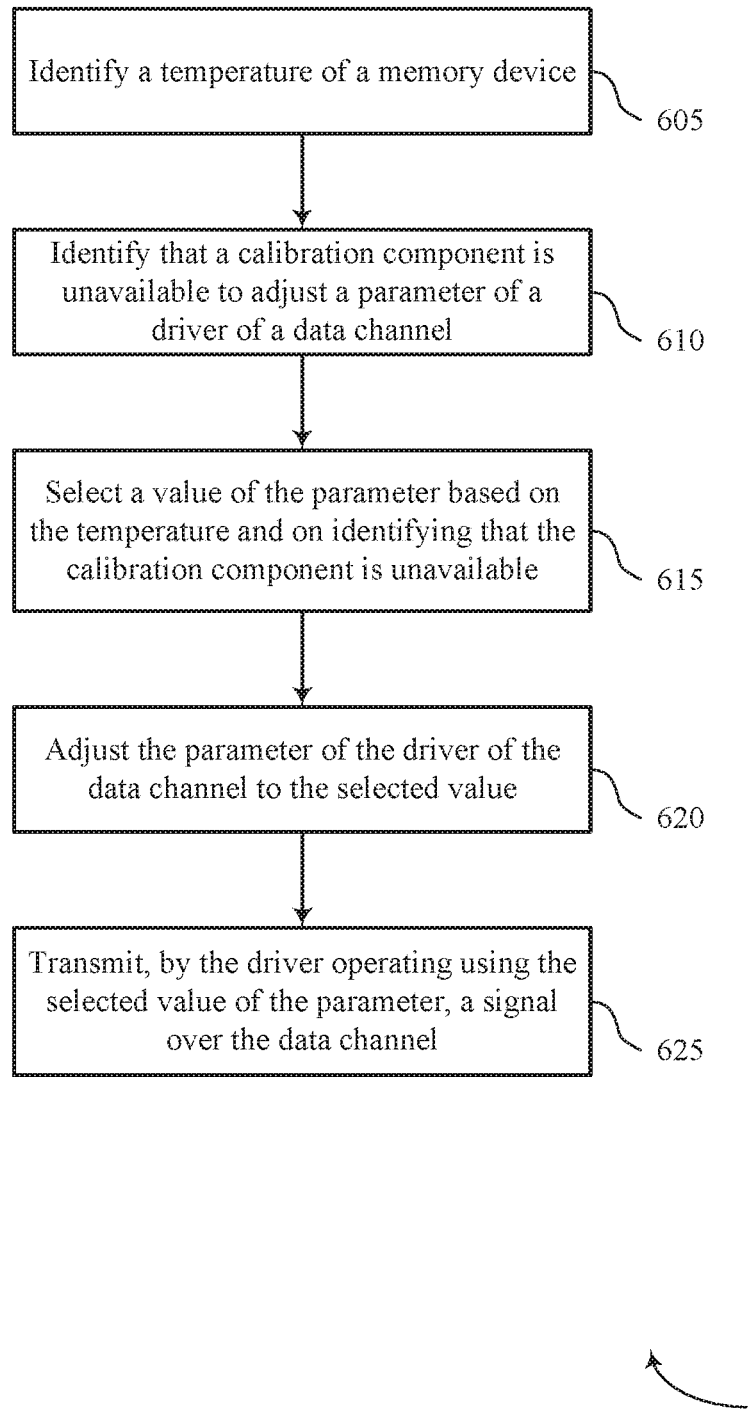
FIGS. 6 and 7 show flowcharts illustrating methods that support adjusting parameters of channel drivers based on temperature in accordance with examples as disclosed herein.

FIG. 6 shows a flowchart illustrating a method or methods 600 that supports adjusting parameters of channel drivers based on temperature in accordance with examples as disclosed herein. The operations of method 600 may be implemented by a memory device or its components as described herein. For example, the operations of method 600 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 605, the memory device may identify a temperature of a memory device. The operations of 605 may be performed according to the methods described herein. In some examples, aspects of the operations of 605 may be performed by a temperature component as described with reference to FIG. 5.

At 610, the memory device may identify that a calibration component is unavailable to adjust a parameter of a driver of a data channel. The operations of 610 may be performed according to the methods described herein. In some examples, aspects of the operations of 610 may be performed by an availability component as described with reference to FIG. 5.

At 615, the memory device may select a value of the parameter based on the temperature and on identifying that the calibration component is unavailable. The operations of 615 may be performed according to the methods described herein. In some examples, aspects of the operations of 615 may be performed by a selection component as described with reference to FIG. 5.

At 620, the memory device may adjust the parameter of the driver of the data channel to the selected value. The operations of 620 may be performed according to the methods described herein. In some examples, aspects of the operations of 620 may be performed by an adjustment component as described with reference to FIG. 5.

At 625, the memory device may transmit, by the driver operating using the selected value of the parameter, a signal over the data channel. The operations of 625 may be performed according to the methods described herein. In some examples, aspects of the operations of 625 may be performed by a transmission component as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for identifying a temperature of a memory device, identifying that a calibration component is unavailable to adjust a parameter of a driver of a data channel, selecting a value of the parameter based on the temperature and identifying that the calibration component is unavailable, adjusting the parameter of the driver of the data channel to the selected value, and transmitting, by the driver operating using the selected value of the parameter, a signal over the data channel.

In some examples of the method 600 and the apparatus described herein, selecting the value may include operations, features, means, or instructions for selecting the value from a set of trim settings that each correspond to a different temperature or different range of temperatures.

Some examples of the method 600 and the apparatus described herein may further include operations, features, means, or instructions for coupling the data channel with a conductive line that corresponds to the selected trim setting from the set of trim settings, where adjusting the parameter of the driver may be based on coupling the data channel with the conductive line.

Some examples of the method 600 and the apparatus described herein may further include operations, features, means, or instructions for identifying a second temperature of the memory device, the second temperature different than the temperature, selecting a second value from a set of trim settings, the second value corresponding to the second temperature and being different than the value, coupling the data channel with a second conductive line that corresponds to the selected second value, adjusting the parameter of the driver of the data channel to the second value based on coupling the data channel with the second conductive line, and transmitting, by the driver operating using the second value of the parameter, a second signal over the data channel.

Some examples of the method 600 and the apparatus described herein may further include operations, features, means, or instructions for receiving, from a temperature sensor of the memory device, a control signal that indicates the temperature, where identifying the temperature may be based on receiving the control signal.

Some examples of the method 600 and the apparatus described herein may further include operations, features, means, or instructions for receiving a control signal that indicates whether the calibration component may be available to adjust the parameter of the driver, where identifying that the calibration component may be unavailable to adjust the parameter of the driver may be based on receiving the control signal.

Some examples of the method 600 and the apparatus described herein may further include operations, features, means, or instructions for identifying a range of temperatures that includes the temperature, where identifying the temperature may be based on identifying the range of temperatures, identifying a second value of the parameter, the second value being associated with an endpoint temperature of the range of temperatures, identifying a difference between the temperature and the endpoint temperature of the range of temperatures, and performing an interpolation procedure using the difference, the endpoint temperature, and the second value, where selecting the value of the parameter may be based on performing the interpolation procedure.

In some examples of the method 600 and the apparatus described herein, the value of the parameter may be selected from a set of trim settings that each corresponds to a different range of temperatures.

In some examples of the method 600 and the apparatus described herein, the parameter may include a configurable impedance of the driver, and the value of the parameter may include a numeric quantity of the configurable impedance of the driver. Some examples of the method 600 and the apparatus described herein may further include operations, features, means, or instructions for adjusting the configurable impedance of the driver that causes a termination impedance of the data channel to be at a configured value.

In some examples of the method 600 and the apparatus described herein, the value may be selected from a quantity of values. In some examples of the method 600 and the apparatus described herein, the value may be selected from eight values.

Figure 7:
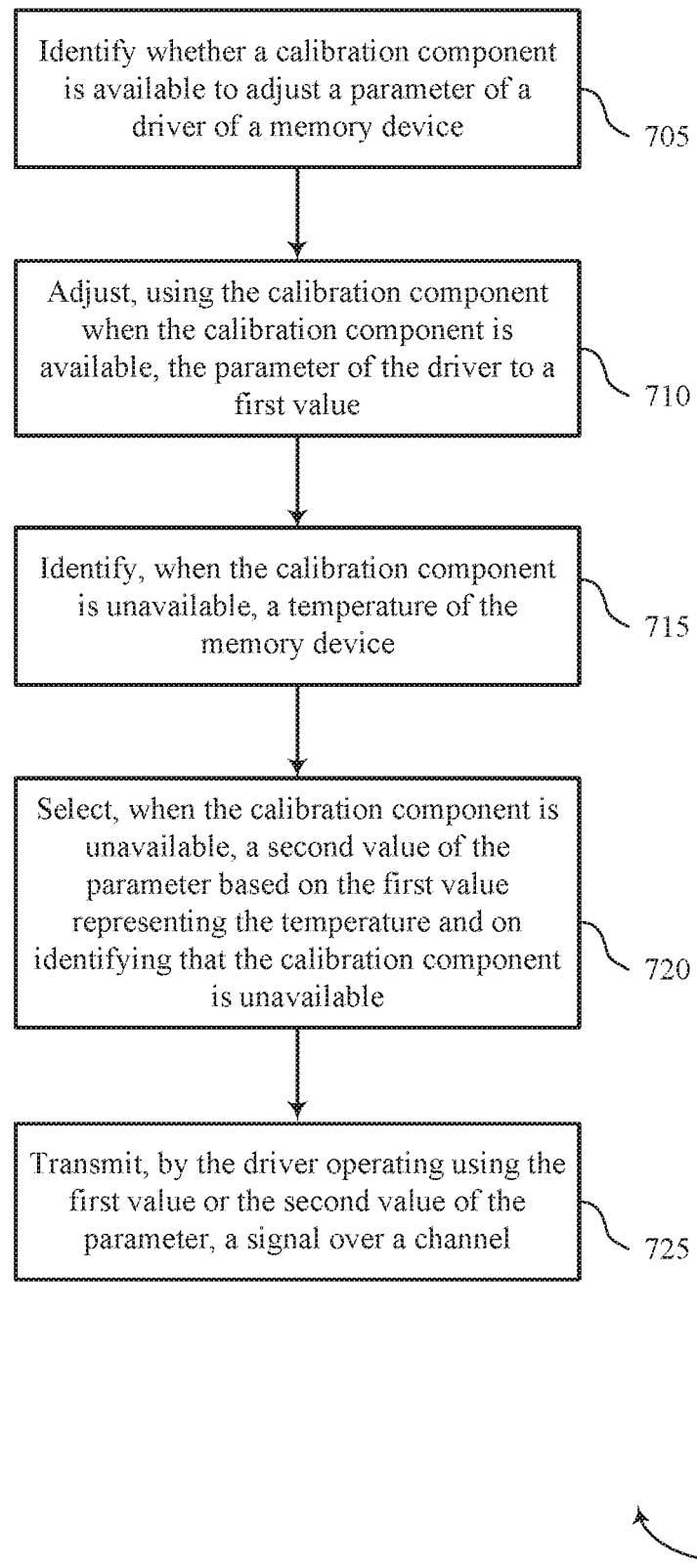

FIG. 7 shows a flowchart illustrating a method 700 that supports adjusting parameters of channel drivers based on temperature in accordance with examples as disclosed herein. The operations of method 700 may be implemented by a memory device or its components as described herein. For example, the operations of method 700 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 705, the memory device may identify whether a calibration component is available to adjust a parameter of a driver of a memory device. The operations of 705 may be performed according to the methods described herein. In some examples, aspects of the operations of 705 may be performed by an availability component as described with reference to FIG. 5.

At 710, the memory device may adjust, using the calibration component when the calibration component is available, the parameter of the driver to a first value. The operations of 710 may be performed according to the methods described herein. In some examples, aspects of the operations of 710 may be performed by a calibration component as described with reference to FIG. 5.

At 715, the memory device may identify, when the calibration component is unavailable, a temperature of the memory device. The operations of 715 may be performed according to the methods described herein. In some examples, aspects of the operations of 715 may be performed by a temperature component as described with reference to FIG. 5.

At 720, the memory device may select, when the calibration component is unavailable, a second value of the parameter based on the first value representing the temperature and on identifying that the calibration component is unavailable. The operations of 720 may be performed according to the methods described herein. In some examples, aspects of the operations of 720 may be performed by a selection component as described with reference to FIG. 5.

At 725, the memory device may transmit, by the driver operating using the first value or the second value of the parameter, a signal over a channel. The operations of 725 may be performed according to the methods described herein. In some examples, aspects of the operations of 725 may be performed by a transmission component as described with reference to FIG. 5.

In some examples, an apparatus as described herein may perform a method or methods, such as the method 700. The apparatus may include features, means, or instructions (e.g., a non-transitory computer-readable medium storing instructions executable by a processor) for: identifying whether a calibration component is available to adjust a parameter of a driver of a memory device; adjusting, using the calibration component when the calibration component is available, the parameter of the driver to a first value; identifying, when the calibration component is unavailable, a temperature of the memory device; selecting when the calibration component is unavailable, a second value of the parameter based on the first value representing the temperature and on identifying that the calibration component is unavailable; and transmitting, by the driver operating using the first value or the second value of the parameter, a signal over a channel.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a driver of a channel of a memory device; a temperature component for determining a temperature of the memory device; a selection component coupled with the temperature component and the driver, where the selection component is configured to receive an indication of the temperature from the temperature component, receive an indication of availability of a calibration component to calibrate the driver, and select a value of a parameter of the driver based on the indication of the temperature and on identifying that the calibration component is unavailable, and where the driver is configured to transmit a signal over the channel using the selected value of the parameter.

Some examples of the apparatus may include an adjustment component coupled with the selection component and the driver, the adjustment component configured to receive an indication of the selected value of the parameter from the selection component and configure the parameter of the driver based on the selected value.

In some examples, the selection component may include operations, features, means, or instructions for a first multiplexer including inputs coupled with a set of conductive lines that each correspond to a different value of the parameter and a selection input coupled with the temperature component and configured to receive the indication of the temperature.

In some examples, the selection component may include operations, features, means, or instructions for a second multiplexer including a first input coupled with an output of the first multiplexer, a second input coupled with the calibration component, a selection input configured to receive an indication of the availability of the calibration component to calibrate the driver, and an output coupled with the driver.

In some examples, the selection component may include operations, features, means, or instructions for an interpolator configured to select the value of the parameter based on a range of temperatures that includes the temperature, a difference between an endpoint temperature of the range of temperatures and the temperature, and a second value of the parameter associated with the endpoint temperature.

Some examples of the apparatus may include the calibration component configured to calibrate the driver based on the temperature of the memory device. In some examples, the selection component may be configured to select the value from a set of values of the parameter stored by a memory component of the memory device. In some examples, the value may be a trim setting selected from a set of trim settings that each correspond to a different range of temperatures of the memory device.

Some examples of the apparatus may include a set of conductive lines coupled to the selection component, each conductive line corresponding to a different value of the parameter, where the selection component selects the value by selecting one of the set of conductive lines. In some examples, the apparatus includes a memory die and the driver, the temperature component, and the selection component may be coupled with the memory die.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   identifying a temperature of a memory device;
   receiving an indication of availability of a calibration component to calibrate a driver of a data channel;
   identifying that the calibration component is unavailable to adjust a parameter of the driver of the data channel based at least in part on the indication;
   selecting a value of the parameter based at least in part on the temperature and based at least in part on identifying that the calibration component is unavailable;
   adjusting the parameter of the driver of the data channel to the selected value; and
   transmitting, by the driver operating using the selected value of the parameter, a signal over the data channel.

2. The method of claim 1, wherein selecting the value comprises:
   selecting the value from a plurality of trim settings that each correspond to a different temperature or different range of temperatures.

3. The method of claim 2, further comprising:
   coupling the data channel with a conductive line that corresponds to the selected value from the plurality of trim settings, wherein adjusting the parameter of the driver is based at least in part on coupling the data channel with the conductive line.

4. The method of claim 1, further comprising:
   receiving, from a temperature sensor of the memory device, a control signal that indicates the temperature, wherein identifying the temperature is based at least in part on receiving the control signal.

5. The method of claim 1, wherein the value of the parameter is selected from a plurality of trim settings that each corresponds to a different range of temperatures.

6. The method of claim 1, wherein:
   the parameter comprises a configurable impedance of the driver; and
   the value of the parameter comprises a numeric quantity of the configurable impedance of the driver.

7. The method of claim 6, wherein adjusting the configurable impedance of the driver causes a termination impedance of the data channel to be at a configured value.

8. The method of claim 1, wherein the value is selected from a quantity of values.

9. The method of claim 8, wherein the value is selected from eight values.

10. A method, comprising:
    identifying a temperature of a memory device;
    identifying that a calibration component is unavailable to adjust a parameter of a driver of a data channel;
    selecting a value of the parameter based at least in part on the temperature and based at least in part on identifying that the calibration component is unavailable;
    adjusting the parameter of the driver of the data channel to the selected value;
    transmitting, by the driver operating using the selected value of the parameter, a signal over the data channel;
    identifying a second temperature of the memory device, the second temperature different than the temperature;
    selecting a second value from a plurality of trim settings, the second value corresponding to the second temperature and being different than the value;
    coupling the data channel with a second conductive line that corresponds to the selected second value;
    adjusting the parameter of the driver of the data channel to the second value based at least in part on coupling the data channel with the second conductive line; and
    transmitting, by the driver operating using the second value of the parameter, a second signal over the data channel.

11. A method comprising:
    identifying a temperature of a memory device;
    identifying a range of temperatures that includes the temperature, wherein identifying the temperature is based at least in part on identifying the range of temperatures;
    identifying that a calibration component is unavailable to adjust a parameter of a driver of a data channel;
    identifying a second value of the parameter, the second value being associated with an endpoint temperature of the range of temperatures;
    identifying a difference between the temperature and the endpoint temperature of the range of temperatures; and
    performing an interpolation procedure using the difference, the endpoint temperature, and the second value;
    selecting a value of the parameter based at least in part on the temperature and based at least in part on identifying that the calibration component is unavailable, wherein selecting the value of the parameter is based at least in part on performing the interpolation procedure;
    adjusting the parameter of the driver of the data channel to the selected value; and
    transmitting, by the driver operating using the selected value of the parameter, a signal over the data channel.

12. An apparatus, comprising:
    a driver of a channel of a memory device;
    a temperature component for determining a temperature of the memory device; and
    a selection component coupled with the temperature component and the driver, wherein the selection component is configured to:
    receive an indication of the temperature from the temperature component;
    receive an indication of availability of a calibration component to calibrate the driver; and
    select a value of a parameter of the driver based at least in part on the indication of the temperature and based at least in part on identifying that the calibration component is unavailable, wherein the driver is configured to transmit a signal over the channel using the selected value of the parameter.

13. The apparatus of claim 12, further comprising:
an adjustment component coupled with the selection component and the driver, the adjustment component configured to receive an indication of the selected value of the parameter from the selection component and configure the parameter of the driver based at least in part on the selected value.

14. The apparatus of claim 12, wherein the selection component comprises:
a first multiplexer including inputs coupled with a plurality of conductive lines that each correspond to a different value of the parameter and a selection input coupled with the temperature component and configured to receive the indication of the temperature.

15. The apparatus of claim 14, wherein the selection component comprises:
a second multiplexer including a first input coupled with an output of the first multiplexer, a second input coupled with the calibration component, a selection input configured to receive the indication of availability of the calibration component to calibrate the driver, and an output coupled with the driver.

16. The apparatus of claim 12, wherein the selection component comprises:
an interpolator configured to select the value of the parameter based at least in part on a range of temperatures that includes the temperature, a difference between an endpoint temperature of the range of temperatures and the temperature, and a second value of the parameter associated with the endpoint temperature.

17. The apparatus of claim 12, further comprising:
the calibration component configured to calibrate the driver based at least in part on the temperature of the memory device.

18. The apparatus of claim 12, wherein the selection component is configured to select the value from a plurality of values of the parameter stored by a memory component of the memory device.

19. The apparatus of claim 18, wherein the value is a trim setting selected from a plurality of trim settings that each correspond to a different range of temperatures of the memory device.

20. The apparatus of claim 12, further comprising:
a plurality of conductive lines coupled to the selection component, each conductive line corresponding to a different value of the parameter, wherein the selection component selects the value by selecting one of the plurality of conductive lines.

21. The apparatus of claim 12, wherein the apparatus comprises a memory die, and wherein the driver, the temperature component, and the selection component are coupled with the memory die.

22. A method, comprising:
identifying that a calibration component is available to adjust a parameter of a driver of a memory device;
adjusting, using the calibration component and based at least in part on determining that the calibration component is available, the parameter of the driver to a first value;
identifying, when the calibration component is unavailable, a temperature of the memory device;
selecting, based at least in part on the calibration component being unavailable, a second value for the parameter that corresponds to the temperature of the memory device; and
transmitting, by the driver operating using the second value of the parameter, a signal over a channel.

* * * * *